United States Patent
Breems et al.

(10) Patent No.: US 9,712,184 B2
(45) Date of Patent: Jul. 18, 2017

(54) SIGMA-DELTA MODULATOR

(71) Applicant: NXP B.V.

(72) Inventors: Lucien Johannes Breems, Eindhoven (NL); Muhammed Bolatkale, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/197,398

(22) Filed: Jun. 29, 2016

(65) Prior Publication Data
US 2017/0019124 A1  Jan. 19, 2017

(30) Foreign Application Priority Data

Jul. 14, 2015 (EP) .................... 15176685

(51) Int. Cl.
*H03M 3/00* (2006.01)
(52) U.S. Cl.
CPC .......... *H03M 3/422* (2013.01); *H03M 3/376* (2013.01); *H03M 3/464* (2013.01); *H03M 3/50* (2013.01); *H03M 3/42* (2013.01); *H03M 3/452* (2013.01); *H03M 3/454* (2013.01)
(58) Field of Classification Search
CPC ........ H03M 3/422; H03M 3/50; H03M 3/376; H03M 3/42; H03M 3/452; H03M 3/454
USPC ....................................... 341/143
See application file for complete search history.

(56) References Cited

U.S. PATENT DOCUMENTS

| 6,292,121 | B1 | 9/2001 | Cake et al. |
| 6,608,581 | B1 | 8/2003 | Semenov |
| 7,561,635 | B2 * | 7/2009 | Norsworthy .......... H03M 3/392 341/143 |
| 2002/0118128 | A1 | 8/2002 | Siferd |
| 2009/0085784 | A1 | 4/2009 | Di Giandomenico et al. |
| 2010/0052959 | A1 | 3/2010 | Huang et al. |
| 2013/0093607 | A1 | 4/2013 | Yasuda et al. |

(Continued)

FOREIGN PATENT DOCUMENTS

| EP | 2802077 A1 | 11/2014 |
| WO | 03043200 A2 | 5/2003 |

OTHER PUBLICATIONS

Extended European Search Report for Patent Appln. No. 15176685.4 (Jan. 28, 2016).

(Continued)

*Primary Examiner* — Khai M Nguyen
(74) *Attorney, Agent, or Firm* — Rajeev Madnawat

(57) ABSTRACT

A sigma-delta modulator comprising a plurality of filter stages in series with each other, wherein at least one of the plurality of filter stages is configured to provide a filter-output-signal; and a plurality of gain stages, each gain stage configured to provide a gain-output-signal. The sigma-delta modulator also includes a filter-output-switching-element configured to selectively couple the filter-output-signal to an input terminal of one of the plurality of gain stages; and a plurality of filter-input-switching-elements. Each of the plurality of filter-input-switching-elements is associated with one of the plurality of filter stages, wherein the plurality of filter-input-switching-elements are configured to selectively couple one of the gain-stage-output-signals to an input terminal of its associated one of the plurality of filter stages.

19 Claims, 4 Drawing Sheets

(56) References Cited

U.S. PATENT DOCUMENTS

2013/0106486 A1     5/2013  Mallinson et al.
2015/0162935 A1*    6/2015  Aaltonen .............. H03M 3/368
                                                    341/143

OTHER PUBLICATIONS

Bolatkale, M. et al. A 4 GHz Continuous-Time ΔΣ ADC With 70 dB DR and 74-dBFS THD in 125 MHz BW , IEEE Journal of Solid-State Circuits, vol. 46, No. 12, pp. 2857-2868 (Dec. 2011).
Norsworthy et al., "Delta-Sigma Data Converters: Theory Design, and Simulation," NY: Wiley, pp. 512 (Oct. 1996). (Description only).

* cited by examiner

SIGMA-DELTA MODULATOR

CROSS-REFERENCE TO RELATED APPLICATIONS

This application claims the priority under 35 U.S.C. §119 of European Patent application no. 15176685.4, filed on Jul. 14, 2015, the contents of which are incorporated by reference herein.

The present specification relates to a sigma-delta modulator and methods of operating a sigma-delta modulator.

According to a first aspect of the present disclosure there is provided a sigma-delta modulator comprising:
  a plurality of filter stages in series with each other, wherein at least one of the plurality of filter stages is configured to provide a filter-output-signal;
  a plurality of gain stages, each gain stage configured to provide a gain-output-signal;
  a filter-output-switching-element configured to selectively couple the filter-output-signal to an input terminal of one of the plurality of gain stages;
  a plurality of filter-input-switching-elements, each of the plurality of filter-input-switching-elements being associated with one of the plurality of filter stages, wherein the plurality of filter-input-switching-elements are configured to selectively couple one of the gain-stage-output-signals to an input terminal of its associated one of the plurality of filter stages.

Such a sigma-delta modulator can operate at high speeds or at low powers while reducing the probability of experiencing meta stability problems.

In one or more embodiments the gain stages are interleaved/in parallel with each other.

In one or more embodiments each of the plurality of gain stages is configured to:
  when it is coupled to the filter-output-signal: process the filter-output-signal in order to provide the gain-output-signal, and sample the filter-output-signal in order to determine a sampled-filter-output-signal; and
  when it is not coupled to the filter-output-signal: process the sampled-filter-output-signal in order to provide the gain-output-signal.

In one or more embodiments the sigma-delta modulator further comprises a controller configured to: provide a FOSE-control-signal to the filter-output-switching-element, wherein the FOSE-control-signal is configured to selectively couple the filter-output-signal to each one of the plurality gain stages sequentially in turn.

In one or more embodiments the controller is configured to: provide FISE-control-signals to the plurality of filter-input-switching-elements, wherein the FISE-control-signals are configured to selectively couple each one of the gain-stage-output-signals to the input terminal of its associated filter stage sequentially in turn.

In one or more embodiments the controller is configured to provide the FISE-control-signals and the FOSE-control-signal such that, for a first clock pulse:
  the FOSE-control-signal is configured to selectively couple the filter-output-signal to a specific one of the plurality of gain stages; and
  the FISE-control-signals are configured to selectively couple the specific one of the plurality gain stages to the input terminal of the last filter stage in the series.

In one or more embodiments the controller is configured to provide the FISE-control-signals and the FOSE-control-signal such that, for each subsequent clock pulse: the FISE-control-signals are configured to selectively couple the specific one of the plurality gain stages to the input terminal of the preceding filter stage in the series of filter stages.

In one or more embodiments the sigma-delta modulator further comprises an output-switching-element, configured to selectively couple one of the gain-stage-output-signals to an output terminal of the sigma-delta modulator.

In one or more embodiments the last filter stage in the series of plurality of filter stages is configured to provide the filter-output-signal.

In one or more embodiments more than one of the plurality of filter stages are configured to, together, provide the filter-output-signal.

In one or more embodiments the sigma-delta modulator further comprises a plurality of adders. Each adder may be associated with one of the plurality of filter stages and may also be associated with one of the plurality of filter-input-switching-elements. Each adder may comprise: a first input terminal configured to receive a previous-filter-stage-input-signal from a preceding filter stage in the series of filter stages, or receive a sigma-delta-input signal if there is no preceding filter stage; a second input terminal configured to receive a feedback signal from the associated one of the plurality of filter-input-switching-elements; and an output terminal configured to provide a next-filter-stage-input-signal to its associated filter stage.

In one or more embodiments the sigma-delta modulator further comprises a plurality of feedback-components. Each of the plurality of feedback-components may be associated with one of the plurality of filter-input-switching-elements and may also be associated with one of the plurality of adders. Each feedback-component may be configured to: receive a gain-stage-output-signal from its associated filter-input-switching-element, perform a digital to analogue conversion on the received gain-stage-output-signal, and provide a feedback signal to its associated adder.

In one or more embodiments the plurality of feedback-components comprise a plurality of feedback-DACs. In one or more embodiments the plurality of feedback-components comprise analogue components.

There may be provided a sigma-delta modulator comprising:
  a first filter stage;
  a second filter stage in series with the first filter stage, wherein the first filter stage and/or the second filter stage are configured to provide a filter-output-signal;
  a first gain stage, configured to provide a first-gain-output-signal;
  a second gain stage, configured to provide a second-gain-output-signal;
  a filter-output-switching-element configured to selectively couple the filter-output-signal to one of the first gain stage and the second gain stage;
  a first-filter-input-switching-element configured to selectively couple the first-gain-stage-output-signal or the second-gain-stage-output-signal to an input terminal of the first filter stage; and
  a second-filter-input-switching-element configured to selectively couple the first-gain-output-signal or the second-gain-output-signal to an input terminal of the second filter stage.

There may be provided a sigma-delta modulator comprising a loop filter in a forward path of the sigma-delta modulator and a quantizer in a feedback path of the sigma-delta modulator. The quantizer may have two or more gain stages in parallel with each other. The output of the loop filter may be selectively couplable to one of the plurality of gain stages in the quantizer. The outputs of the plurality of gain stages may be selectively couplable to one of a plurality of loop filter nodes in the loop filter.

There may be provided an integrated circuit comprising any sigma-delta modulator disclosed herein.

According to a further aspect of the present disclosure there is provided method of operating a sigma-delta modulator, the sigma-delta modulator comprising:
  a plurality of filter stages in series with each other; and
  a plurality of gain stages;
  the method comprising:
    selectively coupling an output terminal of at least one of the plurality of filter stages in the series to an input terminal of one of the plurality of gain stages; and
    selectively coupling an output terminal of one of the plurality of gain stages to input terminals of associated ones of the plurality of filter stages.

There may be provided a computer program, which when run on a computer, causes the computer to configure any apparatus, including a circuit, controller, sigma-delta modulator, or device disclosed herein or perform any method disclosed herein. The computer program may be a software implementation, and the computer may be considered as any appropriate hardware, including a digital signal processor, a microcontroller, and an implementation in read only memory (ROM), erasable programmable read only memory (EPROM) or electronically erasable programmable read only memory (EEPROM), as non-limiting examples. The software may be an assembly program.

The computer program may be provided on a computer readable medium, which may be a physical computer readable medium such as a disc or a memory device, or may be embodied as a transient signal. Such a transient signal may be a network download, including an internet download.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The Figures and Detailed Description that follow also exemplify various example embodiments. Various example embodiments may be more completely understood in consideration of the following Detailed Description in connection with the accompanying Drawings.

One of more embodiments will now be described by way of example only with reference to the accompanying drawings in which.

Figure 3:
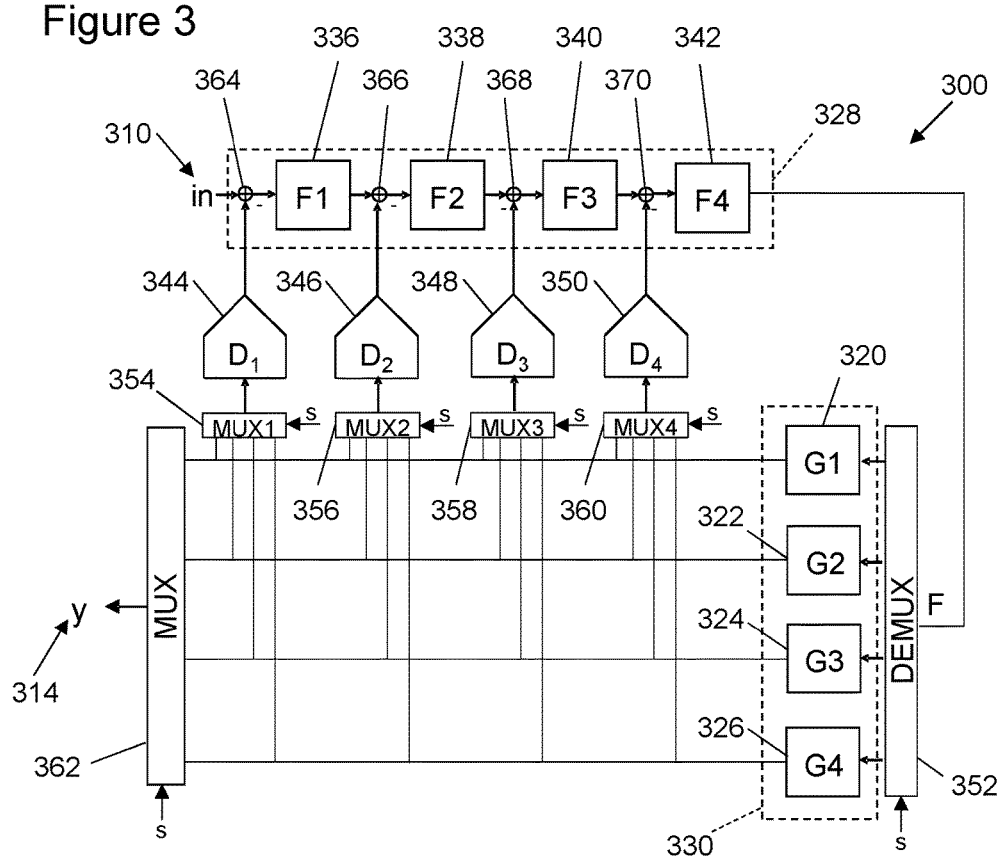
FIG. 3 shows an example embodiment of a sigma-delta modulator that uses an interleaved quantizer structure.
Figure 4:
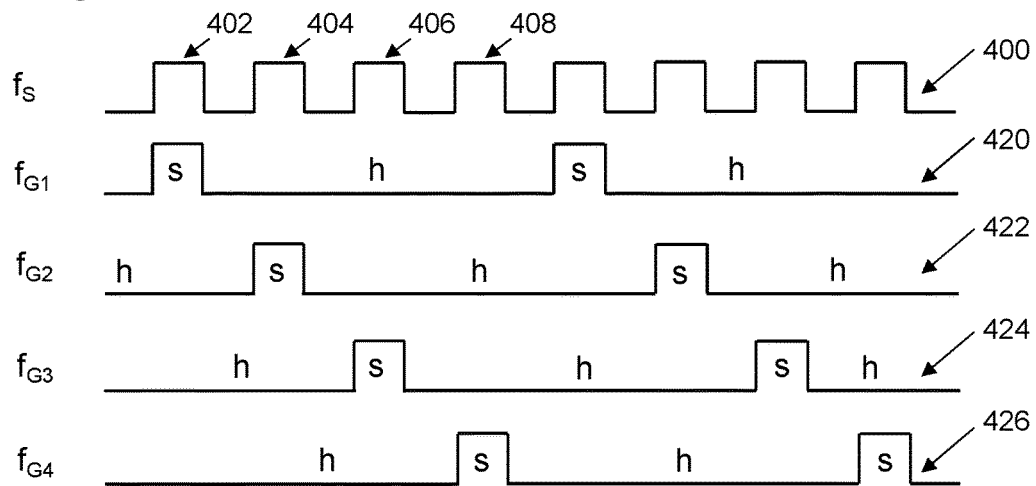
FIG. 4 shows an example timing diagram that represents how a control-signal for the filter-output-switching-element of FIG. 3 controls the connection between the filter-output-signal and each of the gain stages.
Figure 5:
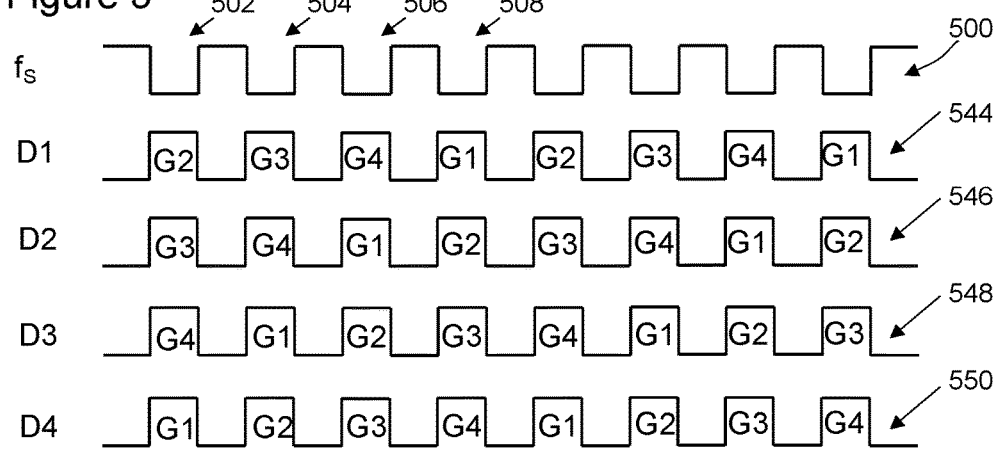
FIG. 5 shows an example timing diagram that represents how control-signals for the filter-input-switching-elements of FIG. 3 control the connection between the gain-stage-output-signals and each of the filter stages.
Figure 7:
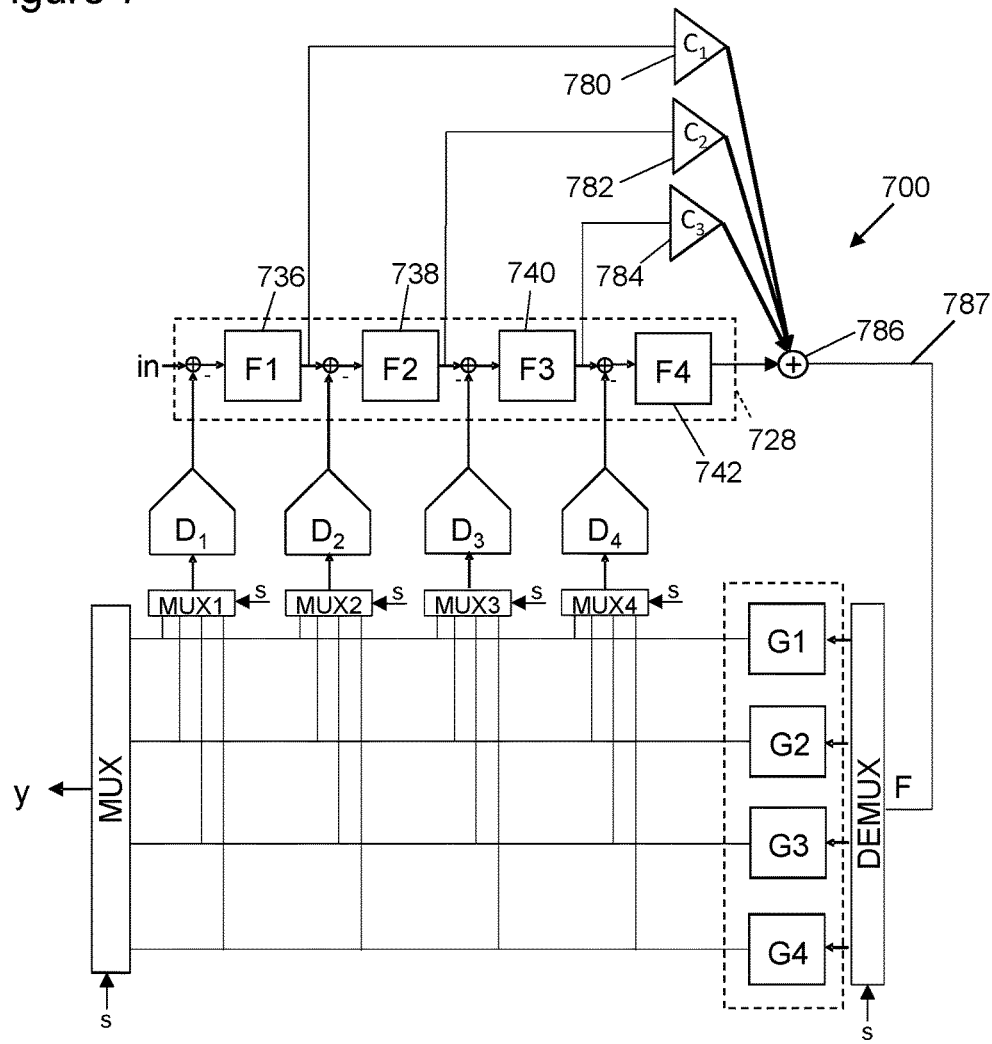
Figure 8:
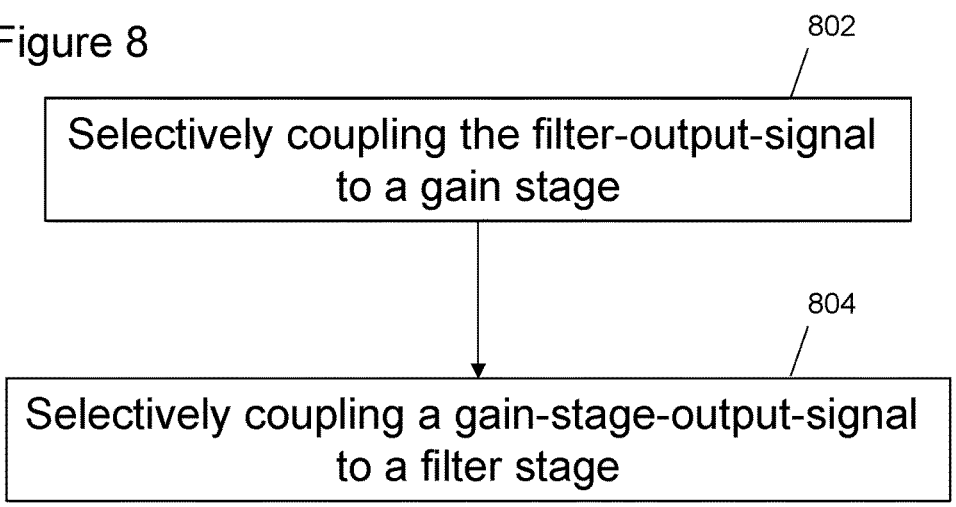

FIGS. 6*a* to 6*d* show the sigma-delta modulator of FIG. 3, when operated according to the timing diagrams of FIGS. 4 and 5;

FIG. 7 shows another example embodiment of a sigma-delta modulator that uses an interleaved quantizer structure; and FIG. 8 illustrates schematically an example embodiment of a method of operating a sigma-delta modulator.

Examples disclosed herein relate to a distributed sigma-delta modulator with an interleaved/parallel quantizer structure. Such a sigma-delta modulator can operate at high speeds or at low powers while reducing the probability of experiencing meta stability problems. Also, because each of the gain stages are in parallel with each other, they can make a decision independently of the other gain stages. This can result in a reduction or avoidance of any negative effects that may otherwise occur for a serialized quantizer structure due to, for example, offsets, as discussed below.

Figure 1:
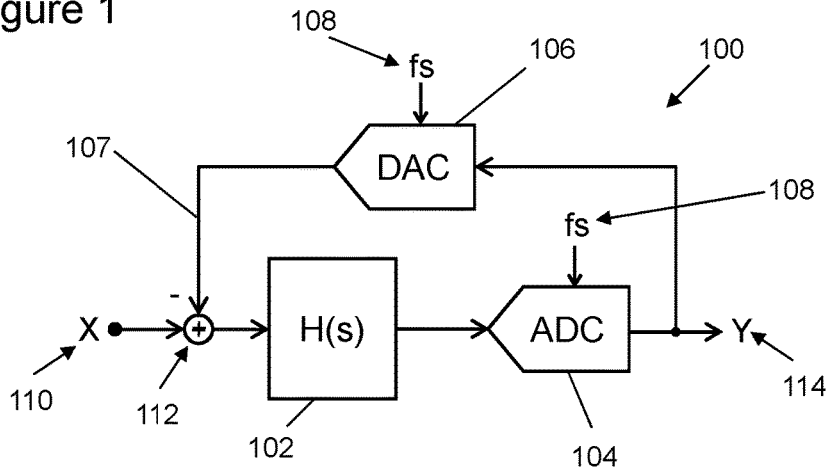
FIG. 1 illustrates a block diagram of a sigma-delta modulator.

FIG. 1 illustrates a block diagram of a sigma-delta modulator 100. The modulator 100 is a feedback system consisting of an adder 112, a loop filter (H(s)) 102, a quantizer or analogue-to-digital converter (ADC) 104 and a digital-to-analogue converter (DAC) 106. The DAC 106 is in the feedback path.

An input X 110 is coupled to a positive input of the adder 112. The output of the adder 112 is coupled to an input of the loop filter (H(s)) 102. The output of the loop filter (H(s)) 102 is coupled to an input of the ADC 104. An output of the ADC 104 is the output Y 114 of the modulator 100.

In order to provide the feedback loop, the output of the quantizer 104 is also coupled to an input of the DAC 106. The output of the DAC 106 is coupled to a negative input of the adder 112 to provide a feedback signal 107. In this way, the DAC 106 is in the feedback path.

The quantizer 104 and the DAC 106 are both clocked by a clock signal 108 that has a sampling frequency fs. Typically the sampling frequency may be higher than the minimum required Nyquist rate such that the modulator 100 is oversampled.

Due to the presence of feedback, the loop filter 102, and the fact that a sigma-delta modulator 100 is usually highly oversampled, the quantization error of the modulator 100 in the signal band of interest is shaped (approximately) according to the inverse of the loop filter 102 characteristic. Also, the quantization error of the quantizer ADC 104 is suppressed in the frequency region where the gain of the loop filter 102 is high. At frequencies where the gain of the loop filter 102 decreases, the quantization noise increases. However, a digital decimation filter (not shown) can be placed at the output of the sigma-delta modulator 100 to filter out the out-of-band quantization noise.

However, as a sigma-delta modulator 100 is a feedback system, it can become increasingly difficult to keep the modulator 100 stable at high sampling frequencies. This may be due to parasitic poles and any additional delays in the circuit, for example caused by the quantizer 104 and/or DAC 106. Another aspect of the sigma-delta modulator 100 (and also other type of A/D converters) is that meta stability of the quantizer 104 can cause errors in the system, particularly for very small input signals to the quantizer 104, which can degrade performance. The (bit) errors occur due to the fact that the feedback signal 107 that goes into the adder 112 is not exactly the same as the output signal 114 that goes through many digital gates and can be considered as an ideal digital signal.

The quantizer 104 can be a particularly important block in a sigma-delta modulator 100 for several reasons. It needs to provide enough gain to enable a digital decision to be made based on a very small signal received from the loop filter 102. Depending on the resolution of the sigma-delta modulator 100 and the specified system bit error rate (BER), the required gain of the quantizer 104 can be for example of the order of $10^7$-$10^8$. However, the delay of the quantizer 104 during the decision making process has a direct impact on the stability of the sigma-delta loop. In practical cases, the delay of the quantizer 104 is usually lower than a sampling period of the clock signal 108. However, for very high speed sigma-delta modulators (for example at 10 GHZ to 20 GHz), the maximum allowable delay time of the quantizer 104 may be only 50 ps. The achievable gain of the quantizer 104 is directly related to the available time budget. Therefore it is increasingly difficult to provide a sufficiently high gain of the quantizer 104 to adequately mitigate the likelihood of meta stability errors, whilst also providing a stable very high-speed sigma-delta modulator 100.

Figure 2:
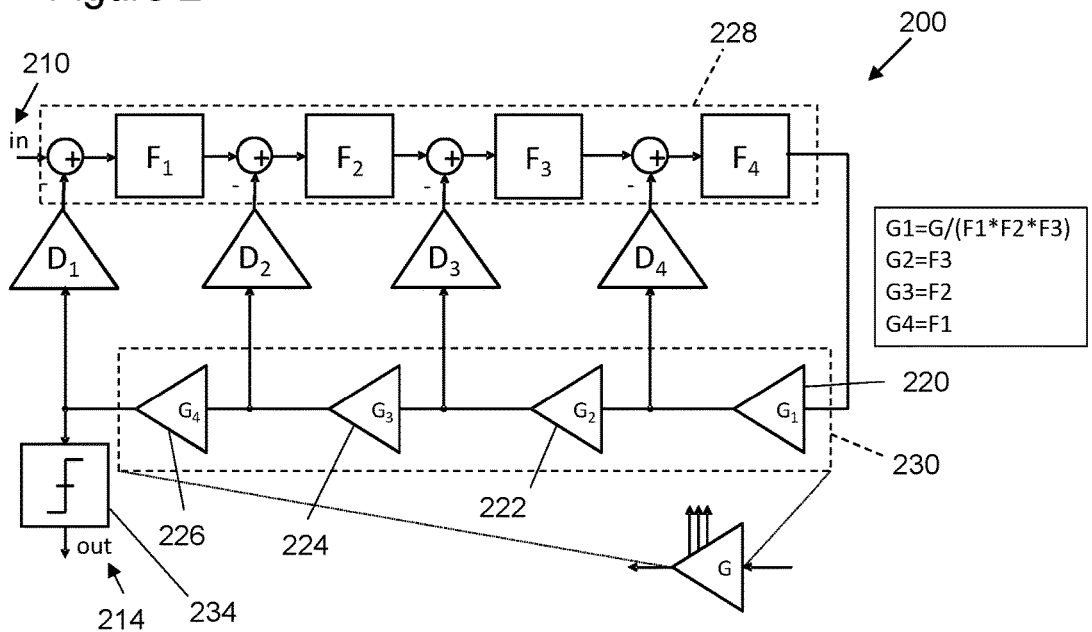
FIG. 2 shows a fourth-order sigma-delta modulator with distributed feedback paths from the outputs of internal comparator gain stages.

FIG. 2 shows a fourth-order sigma-delta modulator 200 with distributed feedback paths from the outputs of internal comparator gain stages. In this example, four quantizer stages G1-G4 220, 222, 224, 226 are cascaded, each introducing 1 period delay.

The sigma-delta modulator 200 comprises a loop filter 228 in a forward path of the sigma-delta modulator 200, and a quantizer 230 in a feedback path of the sigma-delta modulator 200. The quantizer 230 has four gain stages 220, 222, 224, 226. The outputs of the gain stages 220, 222, 224, 226 are each coupled to different loop filter nodes in the loop filter 228. In this way, a plurality of feedback paths in the sigma-delta modulator are defined.

The sigma-delta modulator 200 of FIG. 2 addresses the aspect of meta stability in relation to the clocking speed of the sigma-delta modulator 200. Using a distributed comparator architecture can decouple the comparator gain requirement (related to the meta stability problem) from the clock speed limitation of the sigma-delta modulator 200 (related to the modulator stability).

The output of the fourth gain stage G4 226 is also coupled to an output terminal 214, in this example via an optional comparator 234 that is configured to provide a true digital output signal.

The quantizer stages G1-G4 220, 222, 224, 226 of FIG. 2 can exhibit (different) offsets. For example, each of the quantizer stages G1-G4 can have an input-referred-offset. To explain the problem of offset, consider the case that all quantizer stages G1-G4 of FIG. 2 are 1-bit quantizers. If:

(i) the input-referred-offset of the second quantizer stage G2 224 is larger than the developed output voltage of the first quantizer stage G1 220 after a sampling period, and (ii) the sign of the offset of the second quantizer stage G2 224 is opposite to the output voltage of the first quantizer stage G1 220, then the output sign of the second quantizer stage G2 222 will be opposite to the sign of the output voltage of the first quantizer stage G1 220. That is, the output voltage of the first quantizer stage G1 220 will be overcome by the offset of the second quantizer stage G2 222 such that the second quantizer stage G2 222 provides an incorrect output signal.

By way of summary, due to offsets, the quantizer stages G1-G4 of FIG. 2 can produce different decisions for a specific signal that is received as an input to the quantizer 230 (from the output of the loop filter 228). If this occurs, the noise performance of the sigma-delta modulator 200 may degrade. Also, instability of the modulator may occur, as certain feedback paths can change from negative to positive. Furthermore, other non-idealities, such as dynamic effects, memory effects etc. may cause this problem. Therefore, merely applying offset compensation may not be sufficient to solve one or more these issues.

FIG. 3 shows an example embodiment of a sigma-delta modulator 300 that uses an interleaved quantizer structure, rather than the serialized structure of FIG. 2. In the interleaved parallel quantizer structure, the gain stages are in parallel with each other. As will be discussed in more detail below, the sigma-delta modulator 300 includes a number of switching elements (in this example multiplexers and demultiplexers) that control how signals flow through the sigma-delta modulator 300. FIGS. 4 and 5 illustrate example control signals for the switching elements. FIGS. 6a-6d illustrate graphically how the switching elements are configured, and therefore how signals flow through the sigma-delta modulator, in accordance with the control signals of FIGS. 4 and 5.

Returning to FIG. 3, the sigma-delta modulator 300 includes a loop filter 328 in a forward path of the sigma-delta modulator 300. The loop filter 328 includes a plurality of filter stages in series with each other. In this example, the loop filter 328 includes a first filter stage F1 336, a second filter stage F2 328, a third filter stage F3 340, and a fourth filter stage F4 342. The last filter stage in the series, which in this example is the fourth filter stage F4 342, is configured to provide a filter-output-signal (F). As will be discussed below with reference to FIG. 7, in other examples any one or more of the plurality of filter stages may provide the filter-output-signal.

The loop filter 328 includes a plurality of adders 364, 366, 368, 370. Each adder is associated with an input terminal of one of the plurality of filter stages 336, 338, 340, 342, and is also associated with an output terminal of one of a plurality of filter-input-switching-elements 354, 356, 358, 360, as discussed below.

A first adder 364 has a first input terminal for receiving a sigma-delta-input signal (in) 310, and has a second input terminal for receiving a first feedback signal. An output terminal of the first adder 364 provides a first-filter-stage-input-signal to the first filter stage F1 336. A second adder 366 has a first input terminal for receiving the first-filter-stage-output-signal from the first filter stage F1 336, and has a second input terminal for receiving a second feedback signal. An output terminal of the second adder 366 provides a second-filter-stage-input-signal to the second filter stage F2 338. In a similar way, third and fourth adders 368, 370 are associated with the third filter stage F3 340 and the fourth filter stage F4 342. Each adder receives a previous-filter-stage-input-signal from a preceding filter stage at a first input terminal, or receives the sigma-delta-input signal 310 if there is no preceding filter stage. Each adder also receives a feedback signal from the associated one of the plurality of filter-input-switching-elements at a second input terminal. The adders are configured to provide a next-filter-stage-input-signal to its associated filter stage. In this example, the first input terminal of each of the adders is a summing input terminal, and the second input terminal is a subtracting input terminal. In this way, negative feedback is provided. Each of the adders 364, 366, 368, 370 can be considered as loop filter nodes in the loop filter 328.

It will be appreciated that in other examples the adders may have more than two inputs. Also there is not always need for a specific adder implementation. The adder functionality can be combined with the filter implementation. That is, the adder functionality does have to be provided as a discrete adder component. Also, in some examples additional signal processing (such as filtering) can be performed before adding. Further still, connections can be made to different adders, if for example a filter stage is replicated.

The sigma-delta modulator 300 includes a quantizer 330 in a feedback path of the sigma-delta modulator 300. The quantizer 330 has a plurality of gain stages in parallel with each other. In this example, the quantizer 330 has a first gain stage G1 320, a second gain stage G2 322, a third gain stage G3, 324 and a fourth gain stage G4 326. Each of the gain stages G1-G4 320, 322, 324, 326 provides a gain-stage-output-signal. That is, the first gain stage G1 320 provides a first-gain-stage-output-signal, the second gain stage G2 322 provides a second-gain-stage-output-signal, etc. In some examples, the gain values of the different gain stages will be the same. In some examples, the gain value can be reconfigured during the decision making process.

In this example, the number of loop filter nodes is the same as the number of gain stages. In other examples, the number of loop filter nodes may be greater than the number of gain stages.

The sigma-delta modulator 300 also includes a filter-output-switching-element 352, which in this example is a demultiplexer. The filter-output-switching-element (FOSE) 352 has a FOSE-input-terminal that receives the filter-output-signal from the loop filter 328, and a plurality of FOSE-output-terminals, each of which is connected to an input terminal of one of the gain stages 320, 322, 324, 326. In this example, therefore, the filter-output-switching-element 352 has four FOSE-output-terminals. The filter-output-switching-element 352 also has a FOSE-control-terminal (which may also be referred to as a select-input-terminal), that can receive a FOSE-control-signal (filter-output-switching-element-control-signal) that defines to which of the plurality of FOSE-output-terminals the FOSE-input-terminal is connected. In this way, the filter-output-switching-element 352 can selectively couple the filter-output-signal to an input terminal of one of the plurality of gain stages 320, 322, 324, 326. As will be discussed below, FIG. 4 illustrates an example timing diagram of a FOSE-control-signal that defines how the filter-output-signal can be connected to each of the gain stages 320, 322, 324, 326 in turn for each pulse of a clock signal.

It will be appreciated that each of the control signals described herein can be provided by a controller (not shown).

As shown in FIG. 3, the sigma-delta modulator 300 also includes a plurality of filter-input-switching-elements 354, 356, 358, 360. Each of the plurality of filter-input-switching-elements 354, 356, 358, 360 is associated with one of the plurality of filter stages F1-F4. Therefore there is also one of filter-input-switching-element for each of the adders 364, 366, 368, 370 (loop filter nodes) in the loop filter 328. In this example, the filter-input-switching-elements (FISE) are multiplexers.

Each of the filter-input-switching-elements 354, 356, 358, 360 has a FISE-output-terminal that can provide the feedback signal to an associated adder 364, 366, 368, 370. In this example, the feedback signals are provided indirectly via one of a plurality of feedback-components (D1-D4) 344, 346, 348, 350. Each of the filter-input-switching-elements 354, 356, 358, 360 also has a plurality of FISE-input-terminals, each of which is connected to a gain-stage-output-terminal of one of the gain stages 320, 322, 324, 326. In this example, therefore, the filter-input-switching-elements have four FISE-input-terminals.

The filter-input-switching-elements also have respective FISE-control-terminals, that can receive FISE-control-signals (filter-input-switching-element-control-signals) that define which of the plurality of gain-stage-output-terminals is connected to the FISE-output-terminal. In this way, the filter-input-switching-elements 354, 356, 358, 360 can selectively couple one of the gain-stage-output-signals to an input terminal of its associated filter stage F1-F4 336, 338, 340, 342, via an adder 364, 366, 368, 370.

In this example, a first-filter-input-switching-element 354 is configured to selectively couple one of: (i) the first-gain-stage-output-signal; (ii) the second-gain-stage-output-signal; (iii) the third-gain-stage-output-signal; or (iv) the fourth-gain-stage-output-signal to an input terminal of the first filter stage F1 336. Similarly, each of the other filter-input-switching-elements 356, 358, 360 can selectively couple one of the gain-stage-output-signals to an input terminal of an associated filter stage F2-F4 338, 340, 342.

In this way, the outputs of the plurality of gain stages 320, 322, 324, 326 can be each selectively couplable to the plurality of loop filter nodes in the loop filter 328. As will be discussed below, FIG. 5 illustrates an example timing diagram of FISE-control-signals that define how the gain-stage-output-signals can be connected to each of the filter stages F1-F4 336, 338, 340, 342 in turn for each pulse of a clock signal.

The sigma-delta modulator 300 also includes an output-switching-element 362, which in this example is a multiplexer. The output-switching-element (OSE) 362 has a plurality of OSE-input-terminals, each of which is connected to an output terminal of one of the gain stages 320, 322, 324, 326, and an OSE-output-terminal that provides the sigma-delta-output-signal (y) 314. In this example, therefore, the output-switching-element 362 has four OSE-input-terminals. The output-switching-element 362 also has an OSE-control-terminal, that can receive a OSE-control-signal that defines which of the plurality of gain-stage-output-terminals is connected to the OSE-output-terminal. In this way, the output-switching-element 362 can selectively couple one of the gain-stage-output-signals to an output terminal of the sigma-delta modulator 300 in order to provide the output signal (y) 314. For each sampling period of the clock signal, one of the quantizer gain stages 320, 322, 324, 326 is connected to the output of the modulator via the output-switching-element 362 in a rotating fashion. The selection order of the output-switching-element 362 corresponds to the selection order of the filter-output-switching-element 352.

FIG. 3 is an example of a fourth-order sigma-delta modulator with distributed feedback paths and distributed comparator gains G1-G4. This can be considered as a distributed sigma-delta modulator with an interleaved quantizer structure. It will be appreciated that each of the gain stages can be single-bit or multi-bit quantizers, and need not necessarily all be the same in a single sigma-delta modulator.

As discussed above, the quantizer gain stages 320, 322, 324, 326 are connected to the feedback-components 344, 346, 348, 350 via multiplexers. Each of the plurality of feedback-components 344, 346, 348, 350 is associated with one of the plurality of filter-input-switching-elements 354, 356, 358, 360 and is also associated with one of the plurality of adders 364, 366, 368, 370. Each of the feedback-components 344, 346, 348, 350 can process a signal received at its input and provide a feedback signal as an output signal that is in an appropriate form for the associated adder 364, 366, 368, 370. For example, the feedback signal may be a current signal or a voltage signal. In this example, the feedback-components 344, 346, 348, 350 are implemented as feedback-DACs. In other examples, the feedback-components can be implemented as analogue components.

Each feedback-DAC can: (i) receive a gain-stage-output-signal from its associated filter-input-switching-element 354, 356, 358, 360, (ii) perform a digital to analogue conversion on the received gain-stage-output-signal, and (iii) provide a feedback signal to its associated adder 364, 366, 368, 370. The feedback-DACs are only slaving to the outputs of the quantizer gain stages in this example, and do not contribute to the decision making process. Therefore, their offsets will not significantly impact the performance of the modulator or cause significant instability.

FIG. 4 shows an example timing diagram that represents how a FOSE-control-signal for the filter-output-switching-element of FIG. 3 controls the connection between the filter-output-signal and each of the gain stages. In this example, the FOSE-control-signal selectively couples the filter-output-signal to each one of the plurality gain stages sequentially in turn.

FIG. 4 shows a clock signal 400 having a sampling frequency $f_s$. A signal is also shown as associated with each of the gain stages:
$f_{G1}$ associated with the first gain stage (420);
$f_{G2}$ associated with the second gain stage (422);
$f_{G3}$ associated with the third gain stage (424); and
$f_{G4}$ associated with the fourth gain stage (426).

When each of these $f_{G1}$, $f_{G2}$, $f_{G3}$, $f_{G4}$ signals is high, the associated gain stage is in a sample phase of operation, during which time it is connected to the output terminal of the loop filter, and is therefore coupled to the filter-output-signal. In the sample phase of operation, the gain stage processes the filter-output-signal in order to provide the gain-output-signal, and also samples the filter-output-signal in order to determine a sampled-filter-output-signal.

When each of these signals is low, the associated gain stage is in a hold phase of operation, during which time it is disconnected from the output terminal of the loop filter, and therefore is not is not coupled to the filter-output-signal. During this hold phase, the gain stage processes the sampled-filter-output-signal in order to provide the gain-output-signal. This can enable the gain-output-signal to be refined even when the gain stage is not coupled to the filter-output-signal.

During each positive pulse of the clock signal 400, one of the four gain stages receives the filter-output-signal. As shown in FIG. 4:
for a first pulse 402 of the clock signal 400, the first gain stage ($f_{G1}$) 420 is in a sample phase of operation, and all the other gain stages are in a hold phase of operation;
for a second pulse 404 of the clock signal 400, the second gain stage ($f_{G2}$) 422 is in a sample phase of operation, and all the other gain stages are in a hold phase of operation;
for a third pulse 406 of the clock signal 400, the third gain stage ($f_{G3}$) 424 is in a sample phase of operation, and all the other gain stages are in a hold phase of operation; and
for a fourth pulse of the clock signal 400, the fourth gain stage ($f_{G4}$) 426 is in a sample phase of operation, and all the other gain stages are in a hold phase of operation.

This connection sequence is then repeated for the subsequent pulses in the clock signal 400. In this way, each quantizer gain stage works on a decision during 4 clock cycles of the clock signal 400.

FIG. 5 shows an example timing diagram that represents how FISE-control-signals for the filter-input-switching-elements of FIG. 3 control the connection between the gain-stage-output-signals and each of the feedback-DACs D1-D4, which in turn are associated with each of the filter stages F1-F4. In this example, the FISE-control-signals selectively couple each one of the gain-stage-output-signals to the input terminal of its associated filter stage sequentially in turn.

FIG. 5 shows a clock signal 500 having a sampling frequency fs. This is the same clock signal that is illustrated in FIG. 4. A signal is also shown as associated with each of the feedback-DACs D1-D4:
D1 associated with the first feedback-DAC (544);
D2 associated with the second feedback-DAC (546);
D3 associated with the third feedback-DAC (548); and
D4 associated with the fourth feedback-DAC (550).

FIG. 5 shows that when each of these D1, D2, D3, D4 signals is high, which corresponds to a pulse in the clock signal 500, one of four gain stages is connected to the associated feedback-DAC. When the clock signal 500 is high, the gain stage is sampling and it is output is not valid (less valid). Therefore, the feedback-DACs in this example are connected to associated gain elements (G1-4) for the portion of a clock pulse that the clock signal 500 is low.

The example of FIG. 5 assumes that the feedback DACs are connected only 50% (return-to-zero DAC) of the time. In other examples, not shown, the feedback DACs can also be connected during a full period pulse (non-return-to-zero DAC).

As shown in FIG. 5:
for a first pulse 502 of the clock signal 500:
the first feedback-DAC D1 544 is connected to the second gain stage G2;
the second feedback-DAC D2 546 is connected to the third gain stage G3;
the third feedback-DAC D3 548 is connected to the fourth gain stage G4;
the fourth feedback-DAC D4 550 is connected to the first gain stage G1;
for a second pulse 504 of the clock signal 500:
the first feedback-DAC D1 544 is connected to the third gain stage G3;
the second feedback-DAC D2 546 is connected to the fourth gain stage G4;
the third feedback-DAC D3 548 is connected to the first gain stage G1;
the fourth feedback-DAC D4 550 is connected to the second gain stage G2;
for a third pulse 506 of the clock signal 500:
the first feedback-DAC D1 544 is connected to the fourth gain stage G4;
the second feedback-DAC D2 546 is connected to the first gain stage G1;
the third feedback-DAC D3 548 is connected to the second gain stage G2;
the fourth feedback-DAC D4 550 is connected to the third gain stage G3;
for a fourth pulse 508 of the clock signal 500:
the first feedback-DAC D1 544 is connected to the first gain stage G1;
the second feedback-DAC D2 546 is connected to the second gain stage G2,
the third feedback-DAC D3 548 is connected to the third gain stage G3;

the fourth feedback-DAC D4 550 is connected to the fourth gain stage G4.

This connection sequence is then repeated for the subsequent pulses in the clock signal 500 such that the output of each gain stage is sequentially connected to each of the feedback-DACs in turn, starting from the last feedback-DAC (at a time when the gain stage samples the filter-output-signal) and working backwards through the series of feedback-DACs in order. In this way, the plurality of gain stages are each selectively coupled to one of the plurality of loop filter nodes in the loop filter.

When FIGS. 4 and 5 are considered together, and as illustrated in FIGS. 6a-6d, it can be seen that during any clock pulse (for example the first clock pulse) the filter-output-signal is selectively coupled to a specific one of the plurality of gain stages (due to the state of the FOSE-control-signal), and the output of that specific stage is selectively coupled to the input terminal of the last filter stage in the series (due to the states of the FISE-control-signals). Then, for each subsequent clock pulse, the output of the specific gain stage is instead selectively coupled to the preceding filter stage in the series. In this way, the last filter stage in the series gets a feedback signal soonest, and the first filter stage in the series gets the most settled feedback signal, but later. This can be considered advantageous because the sigma-delta modulator can operate at high speeds or at low powers without suffering from meta stability problems. Also, because each of the gain stages is making a decision independently of the other gain stages, at least some negative effects that may otherwise result from offsets of the gain stages can be reduced or avoided. That is, the same gain stages (latches) can always work on the same decision, such that a single gain stage can provide a feedback signal to all of the filter nodes in the loop filter.

For the example of FIGS. 4 and 5,
the gain stage that is being sampled in a current clock pulse (sample-number=n) is connected to the input of the fourth filter stage, which is the last in the series;
the gain stage that was sampled in the immediately preceding clock pulse (sample-number=n-1) is connected to the input of the third filter stage;
the gain stage that was sampled in the clock pulse before that (sample-number=n-2) is connected to the input of the second filter stage; and
the gain stage that was sampled in the clock pulse before that (sample-number=n-4) is connected to the input of the first filter stage.

In some examples, the most metastable decision (first clock pulse) is provided to the filter stage that has the most gain in front of that stage. For the second clock pulse, the decision is provided to the filter stage that has the second-most gain in front of that stage (compared to the other stages), etc. This approach can provide good results. Nonetheless, it will be appreciated that a different selection order can be used, whilst still providing improvements over a serialized quantizer structure.

FIGS. 6a to 6d show the sigma-delta modulator of FIG. 3, when operated according to the timing diagrams of FIGS. 4 and 5.

Figure 6A:
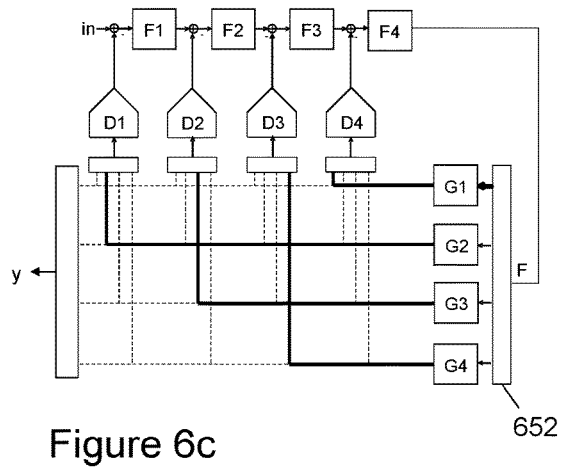

FIG. 6a shows operation during a first clock pulse, during which the first gain stage G1 is sampling the filter-output-signal, as shown schematically by the bold arrow between the filter-output-switching-element 652 and G1. This connection represents operation according to the first clock pulse of FIG. 4. Also during this period, G1 is connected to D4, G4 is connected to D3, G3 is connected to D2, and G2 is connected to D1. These connections represent operation according to the first clock pulse of FIG. 5.

Figure 6B:
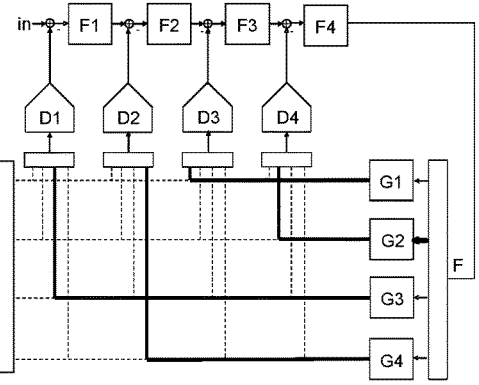
Figure 6C:
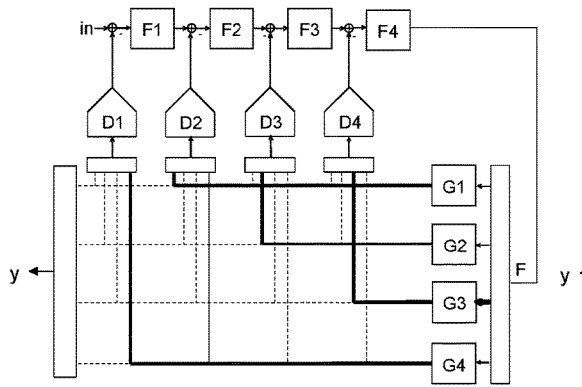
Figure 6D:
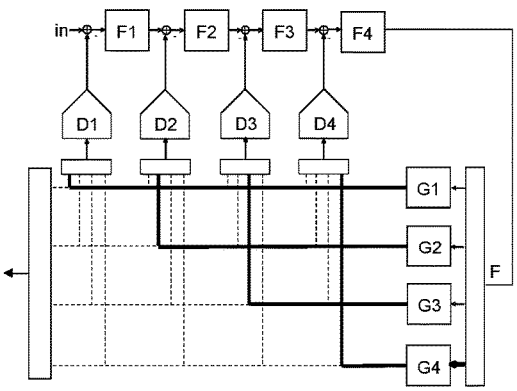

In a similar way, FIG. 6b represents the connections of FIGS. 4 and 5 during the second clock pulse, FIG. 6c represents the connections of FIGS. 4 and 5 during the third clock pulse, and FIG. 6d represents the connections of FIGS. 4 and 5 during the fourth clock pulse.

FIG. 7 illustrates another example embodiment of a sigma-delta modulator 700 that uses an interleaved quantizer structure. Features of the sigma-delta modulator 700 of FIG. 7 that have already been described with reference to FIG. 3 will not necessarily be described again here.

The sigma-delta modulator 700 includes a loop filter 728 in a forward path of the sigma-delta modulator 700. The loop filter 728 includes four filter stages 736, 738, 740, 742 in series with each other. In this example, each of the four filter stages 736, 738, 740, 742 can contribute to, and therefore provide, the filter-output-signal 787.

The sigma-delta modulator 700 includes a filter-stage-output-adder 786, which in this example has four input terminals: one for each of the individual filter stages. The filter-stage-output-adder 786 has an output terminal that provides the filter-output-signal 787.

The sigma-delta modulator 700 includes a first feedforward component $C_1$ 780, a second feedforward component $C_2$ 782, and a third feedforward component $C_3$ 784. The feedforward components can in some implementations apply a function to a received input signal in order to provide an output signal, for example to apply a weighting.

An input terminal of the first feedforward component $C_1$ 780 is connected to the output terminal of the first filter stage 736, an input terminal of the second feedforward component $C_2$ 782 is connected to the output terminal of the second filter stage 738, and an input terminal of the third feedforward component $C_3$ 784 is connected to the output terminal of the third filter stage 740. An output terminal of each of the first feedforward component $C_1$ 780, the second feedforward component $C_2$ 782, and the third feedforward component $C_3$ 784 is connected to a respective input terminal of the filter-stage-output-adder 786. Optionally, a fourth feedforward component (not shown) can be connected between the output of the fourth filter stage 742 and the filter-stage-output-adder 786.

It will be appreciated that one or more of the feedforward components 780, 782, 784 may not be required in some examples, such that at least one of the plurality of filter stages 736, 738, 740, 742 provide the filter-output-signal 787, or more than one of the plurality of filter stages 736, 738, 740, 742 are configured to, together, provide the filter-output-signal.

FIG. 8 illustrates schematically an example embodiment of a method of operating a sigma-delta modulator, such as the ones illustrated in FIGS. 3 and 7. The sigma-delta modulator includes a plurality of filter stages in series with each other, and a plurality of gain stages.

At step 802, the method comprises selectively coupling the filter-output-signal to a gain stage, which may include selectively coupling an output terminal of at least one of the filter stages in the series to an input terminal of one of the plurality of gain stages. At step 804, the method includes selectively coupling a gain-stage-output-signal to a filter stage, which may include selectively coupling an output terminal of one of the plurality of gain stages to input terminals of associated ones of the plurality of filter stages.

It will be appreciated that any components that are described or illustrated herein as being coupled or connected could be directly or indirectly coupled or connected. That is, one or more components could be located between two components that are said to be coupled or connected whilst still enabling the required functionality to be achieved.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The instructions and/or flowchart steps in the above Figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments the set of instructions/method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions/methods illustrated herein and data and instructions associated therewith are stored in respective storage devices, which are implemented as one or more non-transient machine or computer-readable or computer-usable storage media or mediums. Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The invention claimed is:

1. A sigma-delta modulator comprising:
   a plurality of filter stages in series with each other, wherein at least one of the plurality of filter stages is configured to provide a filter-output-signal;
   a plurality of comparators, each comparator configured to provide a comparator output-signal;
   a filter-output-switching-element configured to selectively couple the filter-output-signal to an input terminal of one of the plurality of comparators; and
   a plurality of filter-input-switching-elements, each of the plurality of filter-input-switching-elements being associated with a different respective filter stage of the plurality of filter stages, wherein the plurality of filter-input-switching-elements are configured to selectively couple one of the comparator output-signals to an input terminal of its associated one of the plurality of filter stages.

2. The sigma-delta modulator of claim 1, wherein the comparators are interleaved with each other.

3. The sigma-delta modulator of claim 1, wherein each of the plurality of comparators is configured to:
   when it is coupled to the filter-output-signal: process the filter-output-signal in order to provide the comparator output-signal, and sample the filter-output-signal in order to determine a sampled-filter-output-signal; and
   when it is not coupled to the filter-output-signal: process the sampled-filter-output-signal in order to provide the comparator output-signal.

4. The sigma-delta modulator of claim 1, further comprising a controller configured to:
   provide a filter-output-switching-element-control-signal to the filter-output-switching-element, wherein the filter-output-switching-element-control-signal is configured to selectively couple the filter-output-signal to each one of the plurality of comparators sequentially in turn.

5. The sigma-delta modulator of claim 4, wherein the controller is configured to:
   provide filter-input-switching-element-control-signals to the plurality of filter-input-switching-elements, wherein the filter-input-switching-element-control-signals are configured to selectively couple each one of the comparator-output-signals to the input terminal of its associated filter stage sequentially in turn.

6. The sigma-delta modulator of claim 5, wherein the controller is configured to provide the filter-input-switching-element-control-signals and the filter-output-switching-element-control-signal such that, for a first clock pulse:
   the filter-output-switching-element-control-signal is configured to selectively couple the filter-output-signal to a specific one of the plurality of comparators; and
   the filter-input-switching-element-control-signals are configured to selectively couple the specific one of the plurality of comparators to the input terminal of the last filter stage in the series.

7. The sigma-delta modulator of claim 6, wherein the controller is configured to provide the filter-input-switching-element-control-signals and the filter-output-switching-element-control-signal such that, for each subsequent clock pulse:

the filter-input-switching-element-control-signals are configured to selectively couple the specific one of the plurality of comparators to the input terminal of the preceding filter stage in the series of filter stages.

8. The sigma-delta modulator of claim 5, wherein each of the filter-input-switching-elements includes a respective control-terminal to receive the filter-input-switching-element-control-signals from the controller.

9. The sigma-delta modulator of claim 1, further comprising an output-switching-element, configured to selectively couple one of the comparator output-signals to an output terminal of the sigma-delta modulator.

10. The sigma-delta modulator of claim 1, wherein the last filter stage in the series of plurality of filter stages is configured to provide the filter-output-signal.

11. The sigma-delta modulator of claim 1, wherein more than one of the plurality of filter stages are configured to, together, provide the filter-output-signal.

12. The sigma-delta modulator of claim 1, further comprising a plurality of adders, wherein each adder is associated with one of the plurality of filter stages and is also associated with one of the plurality of filter-input-switching-elements, each adder comprising:
a first input terminal configured to receive a previous-filter-stage-input-signal from a preceding filter stage in the series of filter stages, or receive a sigma-delta-input signal if there is no preceding filter stage;
a second input terminal configured to receive a feedback signal from the associated one of the plurality of filter-input-switching-elements; and
an output terminal configured to provide a next-filter-stage-input-signal to its associated filter stage.

13. The sigma-delta modulator of claim 12, further comprising a plurality of feedback-components, wherein each of the plurality of feedback-components is associated with one of the plurality of filter-input-switching-elements and is also associated with one of the plurality of adders, wherein each feedback-component is configured to:
receive a comparator output-signal from its associated filter-input-switching-element,
perform a digital to analogue conversion on the received comparator-output-signal, and
provide a feedback signal to its associated adder.

14. The sigma-delta modulator of claim 13, wherein the plurality of feedback-components comprise a plurality of feedback-DACs.

15. An integrated circuit comprising the sigma-delta modulator of claim 1.

16. The sigma-delta modulator of claim 1, wherein each respective filter-input-switching-element includes a plurality of input terminals.

17. The sigma-delta modulator of claim 16, wherein, the respective input terminals of each of the filter-input-switching-elements are connected to a respective comparator-output-terminal of one of the comparators.

18. The sigma-delta modulator of claim 1, wherein each of the plurality of filter-input-switching-elements is a multiplexer.

19. A method of operating a sigma-delta modulator, the sigma-delta modulator comprising:
a plurality of filter stages in series with each other; and
a plurality of comparators;
the method comprising:
selectively coupling an output terminal of at least one of the plurality of filter stages in the series to an input terminal of one of the plurality of comparators; and
selectively coupling an output terminal of one of the plurality of comparators to input terminals of associated ones of the plurality of filter stages.

* * * * *